United States Patent
Knorr

(10) Patent No.: US 12,197,126 B2
(45) Date of Patent: Jan. 14, 2025

(54) NANOSTAMPING METHOD AND NANO-OPTICAL COMPONENT

(71) Applicant: OSRAM Opto Semiconductors GmbH, Regensburg (DE)

(72) Inventor: Fabian Knorr, Postbauer-Heng (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 543 days.

(21) Appl. No.: 17/423,808

(22) PCT Filed: Jan. 16, 2020

(86) PCT No.: PCT/EP2020/050991
§ 371 (c)(1),
(2) Date: Jul. 16, 2021

(87) PCT Pub. No.: WO2020/148367
PCT Pub. Date: Jul. 23, 2020

(65) Prior Publication Data
US 2022/0082935 A1    Mar. 17, 2022

(30) Foreign Application Priority Data
Jan. 18, 2019   (DE) .................... 10 2019 101 346.1

(51) Int. Cl.
B29C 33/60      (2006.01)
B29C 37/00      (2006.01)
(Continued)

(52) U.S. Cl.
CPC ........ G03F 7/0002 (2013.01); B29C 37/0053 (2013.01); B29D 11/0073 (2013.01);
(Continued)

(58) Field of Classification Search
CPC .............. B29C 2033/426; B29C 33/60; B29C 37/0053; B29C 2059/023; B29D 11/0073;
(Continued)

(56) References Cited

U.S. PATENT DOCUMENTS

| 5,772,905 A | 6/1998 | Chou |
| 7,255,805 B2 | 8/2007 | Stasiak et al. |

(Continued)

FOREIGN PATENT DOCUMENTS

| DE | 10134763 A1 | 1/2003 |
| EP | 2450724 A1 | 5/2012 |

(Continued)

OTHER PUBLICATIONS

[NPL-1] "Refractive Index of Polymers by Index", Scientific Polymer Products, Inc. (Apr. 20, 2021); <https://scipoly.com/technical-library/refractive-index-of-polymers-by-index/>. (Year: 2021).*

(Continued)

Primary Examiner — Leo B Tentoni
(74) Attorney, Agent, or Firm — Slater Matsil, LLP

(57) ABSTRACT

In an embodiment a nanostamping method includes forming a nanostructure in a layer of optical embossing material on a first carrier substrate by a forming stamp having a nano-relief, wherein the nanostructure comprises a plurality of nano-elevations which are connected via an embossing material base, generating a coated nanostructure by covering the nano-elevations with a filler material layer, wherein the filler material layer and the optical embossing material comprise different refractive indices, applying a second carrier substrate on the coated nanostructure, detaching the first carrier substrate and removing a material of the embossing material base.

19 Claims, 2 Drawing Sheets

(51) Int. Cl.
*B29D 11/00* (2006.01)
*G02B 1/00* (2006.01)
*G02B 5/18* (2006.01)
*G03F 7/00* (2006.01)
*G03F 7/16* (2006.01)
*B29C 33/42* (2006.01)
*B29C 59/02* (2006.01)
*B29L 11/00* (2006.01)

(52) U.S. Cl.
CPC .... *B29D 11/0074* (2013.01); *B29D 11/00769* (2013.01); *G02B 1/005* (2013.01); *G02B 5/1852* (2013.01); *G03F 7/0005* (2013.01); *G03F 7/162* (2013.01); *B29C 2033/426* (2013.01); *B29C 2059/023* (2013.01); *B29L 2011/00* (2013.01)

(58) Field of Classification Search
CPC .......... B29D 11/0074; B29D 11/00769; B29L 2011/00; G03F 7/0002; G03F 7/162
USPC .................................. 264/1.7, 293, 319, 338
See application file for complete search history.

(56) References Cited

U.S. PATENT DOCUMENTS

| | | | |
|---|---|---|---|
| 7,277,619 | B2 | 10/2007 | Ellenson et al. |
| 2004/0079730 | A1 | 4/2004 | Ahrens et al. |
| 2007/0029686 | A1* | 2/2007 | Ikugata ................. G03F 7/0002 264/319 |
| 2007/0059497 | A1 | 3/2007 | Huang et al. |
| 2007/0065960 | A1* | 3/2007 | Fukshima ............... H01L 33/20 438/42 |
| 2008/0024866 | A1 | 1/2008 | Walter et al. |
| 2011/0076353 | A1* | 3/2011 | Shirai ................... G03F 7/0002 264/447 |
| 2011/0266577 | A1 | 11/2011 | Kim et al. |
| 2020/0285145 | A1* | 9/2020 | Watkins ................. G03F 7/0002 |

FOREIGN PATENT DOCUMENTS

| | | | | |
|---|---|---|---|---|
| EP | 2940741 | A1 * | 11/2015 | ......... H01L 33/0025 |
| WO | 0208835 | A2 | 1/2002 | |
| WO | 2006131153 | A1 | 12/2006 | |
| WO | 2011135494 | A2 | 11/2011 | |
| WO | 2016065308 | A1 | 4/2016 | |
| WO | 2016136181 | A1 | 9/2016 | |

OTHER PUBLICATIONS

[NPL-2] "Refractive Index of GaN, Gallium Nitride", Filmetrics (Aug. 19, 2013); <https://www.filmetrics.com/ refractive-index-database/GaN/Gallium-Nitride#:~:text=Gallium%20nitride%20(GaN)%20is%20a,nm%20are%202.37966%20and%200.>. (Year: 2013).*

Chou, S.Y., et al. "Imprint Lithography with 25-Nanometer Resolution," Science, New Series, vol. 272, Issue 5258, Apr. 5, 1996, 5 pages.

* cited by examiner

NANOSTAMPING METHOD AND NANO-OPTICAL COMPONENT

This patent application is a national phase filing under section 371 of PCT/EP2020/050991, filed Jan. 16, 2020, which claims the priority of German patent application 10 2019 101 346.1, filed Jan. 18, 2019, each of which is incorporated herein by reference in its entirety.

TECHNICAL FIELD

The present invention relates to a nanostamping process and a nano-optical component.

BACKGROUND

Nano-optical elements, such as photonic crystals or diffractive elements, which utilize the interaction of electromagnetic radiation with sub-wavelength structures are known. At least in one spatial direction, periodically arranged dielectrics with sufficiently large refractive index differences, whose period length corresponds to about half the light wavelength, lead to photonic band gaps, so that filters, waveguides and optical coupling elements can be realized in a very small space. The incorporation of imperfections ("dopants") in the periodicity on the nanoscale enables the light emission to be specifically influenced and complex filter characteristics to be realized. In addition, strongly pronounced dispersion effects near the photonic band gap can be exploited.

The manufacture of nano-optical components requires a precision of a few nanometres. Therefore, focused electron or ion beams (FIB) or electron beam lithography (EBL) in combination with dry etching are used for structuring. An alternative replication suitable for mass production is the nanostamping method, which has been described for lithography with structure widths of 25 nm or less in the technical article by S. Y. Chou et. al, "Imprint Lithography with 25-Nanometer Resolution," Science, Vol. 272, pp. 85-87 (Apr. 5, 1996), and in U.S. Pat. No. 5,772,905 A.

For an embodiment of the nanostamping method known as hot imprint lithography, a high pressure forming stamp (template) creates nanostructures in a heated embossing material, typically formed by a thermoplastic polymer layer which is heated above glass temperature. A molecular rearrangement takes place at the interface between the nano-relief of the forming stamp and the surface of the embossing material, without large-scale flow of the heated embossing material. After the embossing material has cooled, the forming stamp can be removed. What remains is the inverse image of the nano-relief of the forming stamp.

For an alternative embodiment of the nanostamping method, called illuminated stamping lithography, a low-viscosity polymer is first used, which is introduced in liquid form into the gap between the forming stamp and a carrier substrate. The liquid polymer can also be deposited on a substrate in the form of fine drops using a micro-dispensing system before the forming stamp is brought closer to the substrate to form an intermediate gap. After filling and closing the gap or positioning the forming stamp, the polymer is cured, typically by UV light, using transparent forming stamps, usually made of quartz glass. Alternatively, the carrier substrate can be transparent to the electromagnetic radiation used to crosslink the polymer. Furthermore, instead of optically initiated conversion, thermal curing of the structured polymer is possible.

For examples of illuminated stamping lithography, reference is made to Patent Application Publication Nos. WO 2002/08835 A2 and DE 10134763 A1. Furthermore, Patent Application Publication No. WO 2006/131153 A1 describes the embossing of a forming stamp into a polymer material for the manufacture of a flexible and transparent secondary forming stamp, which is used for illuminated stamping lithography in a second nanostamping step.

Furthermore, for an alternative embodiment of nanostamping as a reverse imprint process, as described by U.S. Patent No. 20070059497 A1, a polymer layer can first be applied to the relief of the forming stamp and be cured. In a subsequent manufacturing step, the cured polymer layer is at least partially deposited on a carrier substrate by a contact pressure process.

For the illuminated stamping lithography and the reverse imprint process, the forming stamp does not exert any embossing pressure. Nevertheless, the term "embossing material" is also used in these embodiments of the nanostamping method for the polymer to be structured, which, after curing, forms at least partial sections of the forming stamp nano-relief in a complementary manner.

The application of nanoprinting for the manufacture of photonic crystals is described by U.S. Pat. No. 7,255,805 B2. Thereby, the three-dimensional complementary structure to the stamp surface created after the embossing step is used to produce a lithographic mask, which is used in a subsequent step to structure an underlying multilayer substrate by etching.

U.S. Pat. No. 7,277,619 B2 describes a further nanostamping method for the manufacture of a photonic crystal. A complementary nanostructure is produced in a layered composite of a separating layer and an optical embossing material by means of a forming stamp, which has a nano-relief with elevations with a spacing of less than 500 nm, which are arranged periodically at least in sections. Then an etch stop layer is deposited on the nanostructure, followed by a release of the release layer. As a result, the etch stop layer remains only on the bottom surfaces of the imprinted recesses in the optical embossing material, so that it can be used as a mask for a subsequent conventional etching step, for example reactive ion etching (RIE), which deposits the photonic crystal through a depression of the nanostructure in the optical embossing material.

Patent Application Publication No. WO 2016/136181 A1 describes the covering of the nanostructure after nanoimprinting with a filler material layer. This can consist of $SiO_2$, which is applied as a spin-on glass layer (SOG) by spin coating. Further examples of the filler material layer are SiN, organic materials with silicon compounds and metals or metal oxides, such as $TiO_2$ or $Al_2O_3$. In a further process step, the part of the filler material layer covering the nano-elevations of the nanostructure is removed by dry etching. In a subsequent selective etching step, a layer is removed in the region of the exposed nanostructure down to the underlying substrate, with the previously etched filler material layer serving as a mask.

The inverse mapping of a nanostructure present after nanostamping into a filler material layer and the transfer to a second substrate is described by WO 2016/065308 A1 for the manufacture of transparent forming stamps starting from a master template. For this purpose, a nanoimprinted layer is coated on a first substrate by chemical vapor deposition (CVD) or by atomic layer deposition (ALD) in such a way that the nanostructure is completely covered with a dielectric filler material layer, for example $SiO_2$. After planarization of the filler material layer, a second substrate of glass is attached to the levelled surface by anodic bonding or by the application of an adhesive layer. The first substrate is then removed by detaching a release layer from the embossed material. This release layer can, for example, consist of a positive resist which can be dissolved by a bath in a basic solution. The then exposed embossing layer is completely removed in a subsequent process step, for example by an oxygen plasma treatment. Then the filler material layer is exposed, which has the nano-relief of the master-template.

The transfer of a structure manufactured by nanostamping from a first substrate to a second substrate for the manufacture of a nano-optical component is the subject matter of Patent Application Publication No. EP 2450724 A. It describes the manufacture of a stamped nanostructure on a multilayer substrate comprising a support layer permanently bonded to the embossing material and a removable base substrate. A release layer is arranged between the support layer and the base substrate so that the nanostructure can be separated from the base substrate in conjunction with the support layer and transferred to a second carrier substrate. Thus, the base substrate can be selected for the requirements of nanostamping, while the second carrier substrate is adaptable to the application of the nano-optical component.

SUMMARY

Embodiments provide a nanostamping method that simplifies the manufacture of a nano-optical component. Further embodiments provide a nano-optical component with improved performance characteristics.

For the nanostamping method according to embodiments of the invention, a nanostructure is formed in a layer of optical embossing material on a first carrier substrate by means of a forming stamp having a nano-relief, wherein the nanostructure comprises a plurality of nano-elevations which are connected via an embossing material base. In the present context, an optical embossing material is understood to be a material which is transparent for the intended wavelength range for the use of the nano-optical element and which can be structured by nanostamping with sub-wavelength precision.

In a subsequent step, a coated nanostructure is generated by covering the nano-elevations with a filler material layer, the filler material layer and the optical embossing material having different refractive indices. Then, a second carrier substrate is applied on the coated nanostructure, the first carrier substrate is detached, and the embossing material base is completely removed.

The nanostamping method according to embodiments of the invention allows the manufacture of a nano-optical component with improved performance characteristics, since only the part of the optical embossing material structured by the stamping is present in the finished device and the unstructured part of the optical embossing material is removed. Accordingly, the stamped nano-elevations in the optical embossing material, which are arranged with a predefined spacing with sub-wavelength precision, must be separated from each other. For this purpose, an embossing material base connecting the nano-elevations is first exposed on the rear side by a substrate change and removed by layer ablation in a further step, so that deeper etching steps in the area of the optically effective structure, i.e. the sequence of the nano-elevations applied by the nanostamping, can be dispensed with due to the rear-side material removal, thus resulting in a simplified manufacturing method.

The embossing material base to be removed arises because the optical embossing material layer for stamping must be dimensioned in such a way that a certain positional error of the forming stamp can be compensated. At the same time, the optical embossing material layer must be applied with a sufficient layer thickness to distribute embossing forces or to ensure a sufficient inflow of the initial product of the optical embossing material. Accordingly, the initial layer thickness of the optical embossing material is large compared to the maximum pitch of the nano-relief on the forming stamp, which determines the vertical extent of the nano-elevations in the optical embossing material after structuring. Different embodiments can be used for the embossing process to produce the nanostructure in the optical embossing material. In particular, a design as hot embossing lithography, as illuminated stamping lithography or as reverse imprint process is possible.

The filler material for coating the nanostructure formed in the optical embossing material covers the nano-elevations arranged at predetermined intervals with sub-wavelength precision and fills the valleys between adjacent nano-elevations. Therefore, the optical embossing material and the filling material used must have a sufficiently large refractive index difference. For an advantageous embodiment, the difference of the real parts of the refractive indices of the optical embossing material and the filler material layer is larger than 0.5 and preferably larger than 0.8 for a wavelength range from 380 nm to 780 nm and/or from 0.78 μm to 1.4 μm and/or from 1.4 μm to 3.0 μm.

For a preferred embodiment of the nanostamping method, a thermoplastic polymer, in particular polymethyl methacrylate, is used for the optical embossing material. The application can be done by spin coating of a mixture of thermoplastic and a solvent, such as 2 methyoxyethyl acetate. Furthermore, a photoreactive epoxy resin is preferred as an optical embossing material for the manufacture of IR nano-optics.

Silica is preferred as a filler material to cover the nano-elevations, which is applied in a mixture with solvent as a spin-on glass layer to form a coated nanostructure on the nano-stamped optical embossing material. $Al_2O_3$ represents another preferred filling material. Applicable coating methods are spin coating, chemical vapor deposition or an atomic layer deposition.

For the second carrier substrate, which is applied to the coated nanostructure, a material that is transparent in a wavelength range from 380 nm to 780 nm and/or from 0.78 μm to 1.4 μm and/or from 1.4 μm to 3.0 μm is advantageous. Quartz glass is particularly preferred. The bond to the surface of the filler material coating is made by anodic bonding or by means of a transparent adhesive layer.

For a preferred further design, a planarization of the coated nanostructure is carried out prior to the application of the second carrier substrate, which can be carried out by a combined chemical-mechanical process. Advantageously, the planarization of the coated nanostructure is carried out in such a way that the nano-elevations in the optical embossing material are not cut.

To facilitate the detachment of the first carrier substrate, a release layer is preferably disposed between the layer of optical embossing material and the first carrier substrate. For an advantageous embodiment, a release layer that can be removed in a liquid bath is used. For this purpose, a positive resist can be chosen that is soluble in a basic solution.

After the detachment of the first carrier substrate, the unstructured part of the optical embossing layer, the embossing material base, becomes accessible from its rear side and can be ablated down to the optically active part of the nanostructure. Thin film ablation techniques, such as plasma etching, ion beam etching, or laser ablation, may be used for this purpose.

For one embodiment, the thin film ablation process completely removes the embossing material base and additionally cuts the optical nanostructure. This results in the removal of all remnants of the embossing material base, so that the optically effective parts of the nanostructure, which represent nano-elevations after nanostamping, are reliably separated from each other. In addition, edge roundings are removed in the areas of the nano-elevations that were originally near the bottom, so that the aspect ratio of the nanostructure is improved.

For an advantageous further design, a protective coating is applied to a component surface exposed by the material removal of the embossing material base. In this case, the protective coating should advantageously be selected such that there is a significant difference from the refractive index of the optical embossing material and only a small or no difference from the refractive index of the filler material. Preferably, a difference in the real parts of the refractive indices of the protective coating and the filler material layer is less than 0.1 and preferably less than 0.05 for a wavelength range from 380 nm to 780 nm and/or from 0.78 μm to 1.4 μm and/or from 1.4 μm to 3.0 μm. Particularly preferably, the protective coating and the filler material layer are made of the same material. Furthermore, the protective coating is advantageously a spin-on glass layer and is particularly preferably made of silicon dioxide or $Al_2O_3$.

The nano-optical component according to embodiments of the invention comprises a carrier substrate and a nanostructure with nano-elevations of optical embossing material arranged with a predefined spacing. Between the carrier substrate and the nano-elevations there is a filler material layer which forms a continuous layer and additionally fills the spaces between the nano-elevations, whereby the nano-elevations and the filler material layer must have different refractive indices.

Due to the removal of the embossing material base, the nano-elevations are present separately from each other and, due to the embedding in the filler material layer, form a floating structure with a good optical performance characteristic.

The carrier substrate of the nano-optical component according to embodiments of the invention represents the component designated as the second carrier substrate for the manufacturing method. In this context, the carrier substrate is preferably selected to be transparent depending on the wavelength range intended for the respective application. Particularly preferred is a transparency of the carrier substrate for a wavelength range from 380 nm to 780 nm and/or from 0.78 μm to 1.4 μm and/or from 1.4 μm to 3.0 μm.

For an advantageous further development, a protective coating is applied to the surface of the nanostructure facing away from the carrier substrate. Preferably, this is designed in such a way that there is no significant refractive index difference between the filler material layer and the protective coating. Advantageously, the difference in the real parts of the refractive indices of the protective coating and the filler material layer is less than 0.1 and preferably less than 0.05 for a wavelength range from 380 nm to 780 nm and/or from 0.78 μm to 1.4 μm and/or from 1.4 μm to 3.0 μm. A particularly preferred embodiment is one in which the filler material layer and the protective coating consist of the same material.

BRIEF DESCRIPTION OF THE DRAWINGS

Exemplary embodiments of the invention are explained below in connection with figure illustrations. These show, in each case schematically, the following.

DETAILED DESCRIPTION OF ILLUSTRATIVE EMBODIMENTS

FIG. 1 shows a schematically simplified sectional view of a first carrier substrate (3) made of silicon with a layer of optical embossing material (2), which can be structured by means of a nanostamping method and is also transparent in the wavelength range selected for the application. For the embodiment shown, polymethyl methacrylate, a thermoplastic suitable for hot embossing lithography, is available, which is applied to the first carrier substrate (3) by spin coating of a mixture of thermoplastic and 2 methyoxyethyl acetate as a solvent. After drying and baking of the solvent at, for example 95°, a layer of optical embossing material (2) is formed on the first carrier substrate (3) with an average layer thickness of greater than 1 μm, which is substantially greater than the structure width of the nanostructure to be applied. In this case, the layer thickness for the optical embossing material (2) is adapted in such a way that large-area forming stamping is possible.

Figure 1A:
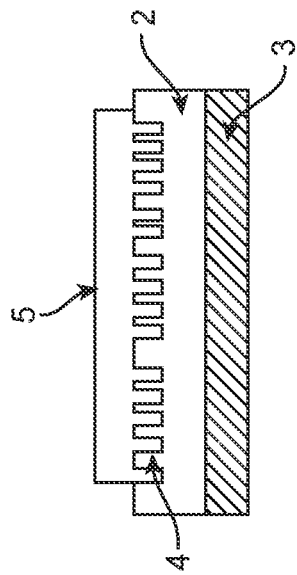
FIGS. 1a-1g show the nanostamping method according to embodiments of the invention for manufacturing a nano-optical component.

Further FIG. 1a shows a nickel forming stamp (5) with a nano-relief (4) which represents the negative shape of the nanostructure to be formed and has a maximum pitch of 500 nm. The nano-relief (4) is provided with a coating of polytetrafluoroethylene to improve the stamp release.

Figure 1B:
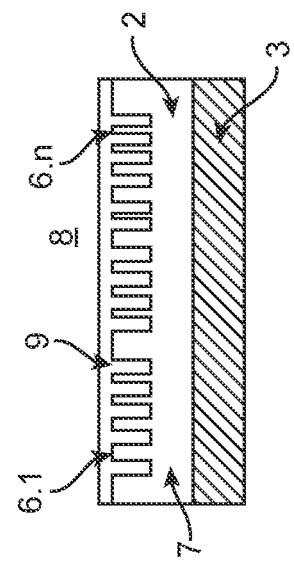
Figure 1C:
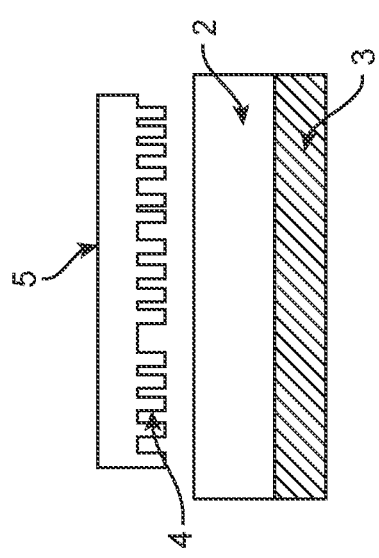

FIG. 1b shows the nanostamping method step, in which the forming stamp (5) is pressed under high pressure into the optical embossing material (2), which is heated above the glass temperature. As a result, the nanostructure (1) shown in FIG. 1 is formed in the layer of optical embossing material (2), the depth extent of which is determined by the pitch of the nano-relief (4) of the forming stamp (5) and is less than 500 nm. Accordingly, an embossing material base (7) under the nanostructure (1) remains unstructured.

The nanostructure (1) has nano-elevations (6.1, . . . , 6.n) with a high aspect ratio, which are arranged at predetermined lateral spacings below 500 nm and typically below 100 nm. There are periodic sequences of nano-elevations (6.1, . . . , 6.n) and free areas in one or two directions, at least over partial areas, which are formed by the valleys between the nano-elevations (6.1, . . . , 6.n). The period length of these sequences is less than half the wavelength of the intended optical application. In addition, interruptions of the periodic sequence are present at predetermined positions, which serve to adjust the optical bandgap.

Figure 1D:
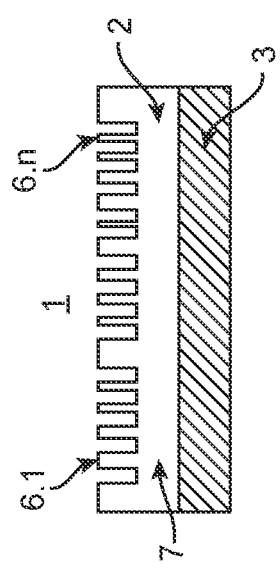

FIG. 1d shows a filler material layer (9) applied to the nanostructure (1), covering the nano-elevations (6.1, . . . , 6.n) and filling the valleys between them, thus forming a coated nanostructure (8). Silicon dioxide is used as the filler material layer (9), which is applied as a spin-on glass layer. The spin-on coating results in a flat surface of the coated nanostructure (8), which can be further levelled by a mechanical-chemical planarization process not shown in detail.

Figure 1E:
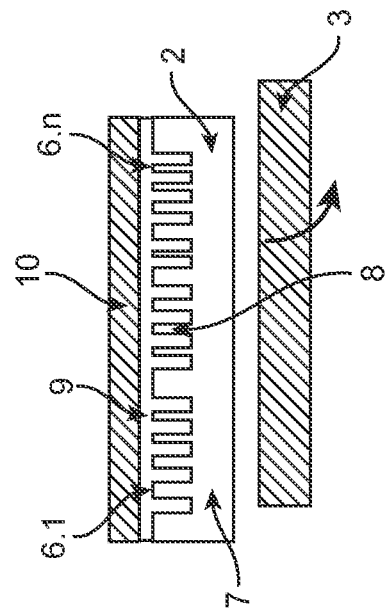
Figure 1F:
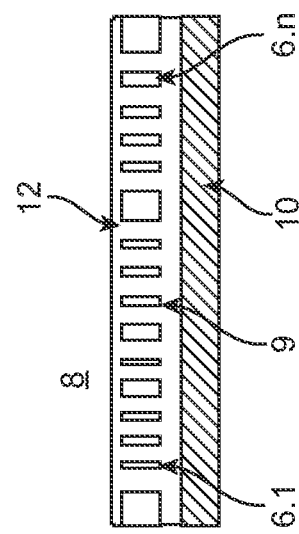

FIG. 1e shows the application of a second carrier substrate (10) of quartz glass on the coated nanostructure (8) by means of anodic bonding, so that a detachment of the first carrier substrate (3) shown in FIG. 1f can be carried out. For this purpose, a layer of a positive resist removable by means of a basic solution is provided as a release layer (13) between the layer of optical embossing material (3) and the first carrier substrate (3). After removal of the first carrier substrate (3), the embossing material base (7) is accessible from the rear side and can be removed by means of an oxygen plasma treatment.

Figure 1G:
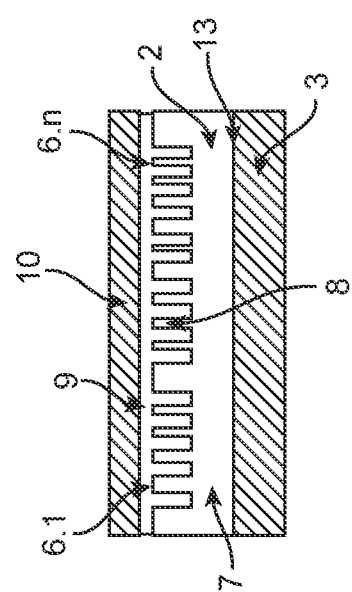

The result of the plasma etching shown in FIG. 1g illustrates the complete removal of the embossing material base (7) so that the nano-elevations (6.1, . . . , 6.n) are separated from each other and form a free-floating nanostructure (1) in the filler material layer (9).

Figure 1H:
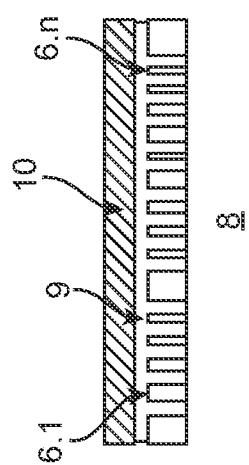
FIG. 1h shows the final step for a further development of the nanostamping method according to embodiments of the invention and a nano-optical component.

For a further development shown in FIG. 1h, a protective coating (12) consisting of silicon dioxide and thus of the same material as the filler material layer (9) is applied to the surface of the coated nanostructure (8) exposed by the material removal of the embossing material base. The silicon dioxide is applied as a spin-on glass layer.

Further embodiments of the invention within the scope of the following claims are conceivable.

The invention claimed is:

1. A nanostamping method for manufacturing a nano-optical component, the method comprising:
   forming a nanostructure in a layer of an optical embossing material on a first carrier substrate by a forming stamp having a nano-relief, wherein the nanostructure comprises a plurality of nano-elevations which are connected via an embossing material base;
   generating a coated nanostructure by covering the nano-elevations with a filler material layer, wherein the filler material layer and the optical embossing material comprise different refractive indices;
   applying a second carrier substrate to the coated nanostructure;
   detaching the first carrier substrate; and
   removing a material of the embossing material base so that the optical embossing material remains in the coated nanostructure.

2. The nanostamping method according to claim 1, further comprising applying a protective coating to a component surface exposed by the material removal of the embossing material base.

3. The nanostamping method according to claim 2, wherein a difference of real parts of the refractive indices of the protective coating and the filler material layer is smaller than 0.1 for a wavelength range from 380 nm to 780 nm.

4. The nanostamping method according to claim 2, wherein a difference of real parts of the refractive indices of the protective coating and the filler material layer is smaller than 0.1 for a wavelength range from 0.78 µm to 1.4.

5. The nanostamping method according to claim 2, wherein the protective coating and the filler material layer consist essentially of the same material.

6. The nanostamping method according to claim 2, wherein the protective coating is formed as a spin-on glass layer.

7. The nanostamping method according to claim 1, wherein a difference of real parts of the refractive indices of the layer of optical embossing material and the filler material layer is greater than 0.5 for a wavelength range from 380 nm to 780 nm.

8. The nanostamping method according to claim 1, wherein a difference of real parts of the refractive indices of the layer of optical embossing material and the filler material layer is greater than 0.5 for a wavelength range from 0.78 µm to 1.4 µm.

9. The nanostamping method according to claim 1, wherein a release layer is arranged between the first carrier substrate and the layer of optical embossing material.

10. The nanostamping method according to claim 1, further comprising planarizing the coated nanostructure before applying the second carrier substrate.

11. The nanostamping method according to claim 10, wherein planarizing the coated nanostructure comprises planarizing that does not cut the nano-elevations of optical embossing material.

12. The nanostamping method according to claim 1, wherein the filler material layer is a spin-on glass layer.

13. The nanostamping method according to claim 1, wherein the second carrier substrate is transparent in a wavelength range from 380 nm to 780 nm and/or from 0.78 µm to 1.4 µm and/or from 1.4 µm to 3.0 µm.

14. The nanostamping method according to claim 2, wherein a difference of real parts of the refractive indices of the protective coating and the filler material layer is smaller than 0.1 for a wavelength range from 1.4 µm to 3.0 µm.

15. The nanostamping method according to claim 2, wherein a difference of real parts of the refractive indices of the protective coating and the filler material layer is smaller than 0.1 for a wavelength range from 0.78 µm 3.0 µm.

16. The nanostamping method according to claim 1, wherein a difference of real parts of the refractive indices of the layer of optical embossing material and the filler material layer is greater than 0.5 for a wavelength range from 1.4 µm to 3.0 µm.

17. The nanostamping method according to claim 1, wherein a difference of real parts of the refractive indices of the layer of optical embossing material and the filler material layer is greater than 0.5 for a wavelength range from 0.78 µm to 3.0 µm.

18. A nanostamping method for manufacturing a nano-optical component, the method comprising:
    forming a nanostructure in a layer of an optical embossing material on a first carrier substrate by a forming stamp having a nano-relief, wherein the nanostructure comprises a plurality of nano-elevations which are connected via an embossing material base;
    generating a coated nanostructure by covering the nano-elevations with a filler material layer, wherein the filler material layer and the optical embossing material comprise different refractive indices;
    applying a second carrier substrate to the coated nanostructure;
    detaching the first carrier substrate;
    removing a material of the embossing material base; and
    applying a protective coating to a component surface exposed by the material removal of the embossing material base.

19. The nanostamping method according to claim 18, wherein a difference of real parts of the refractive indices of the protective coating and the filler material layer is smaller than 0.1 for a wavelength range from 380 nm to 780 nm.

* * * * *